United States Patent [19]

Higgins, III et al.

[11] Patent Number: 5,361,490
[45] Date of Patent: Nov. 8, 1994

[54] METHOD FOR MAKING TAPE AUTOMATED BONDING (TAB) SEMICONDUCTOR DEVICE

[75] Inventors: Leo M. Higgins, III, Austin, Tex.; Maurice S. Karpman, Medford, Mass.

[73] Assignee: Motorola, Inc., Schaumburg, Ill.

[21] Appl. No.: 144,464

[22] Filed: Nov. 1, 1993

Related U.S. Application Data

[62] Division of Ser. No. 745,655, Aug. 16, 1991, Pat. No. 5,289,032.

[51] Int. Cl.⁵ ............................................. H01R 43/00
[52] U.S. Cl. ..................................... 29/827; 437/206; 437/217
[58] Field of Search ..................... 437/206, 220, 217; 29/827

[56] References Cited

U.S. PATENT DOCUMENTS

| | | |
|---|---|---|
| 4,544,238 | 10/1985 | Nickol ................................ 350/336 |
| 4,721,993 | 1/1988 | Walter . |
| 4,803,540 | 2/1989 | Moyer et al. . |
| 4,859,614 | 8/1989 | Sugahara et al. ........................ 437/8 |
| 4,865,193 | 9/1989 | Shimamoto et al. ................ 206/330 |
| 4,947,237 | 8/1990 | Fusaroli . |
| 4,977,442 | 12/1990 | Suzuki et al. . |
| 5,053,852 | 1/1991 | Biswas et al. . |

FOREIGN PATENT DOCUMENTS

| | | |
|---|---|---|
| 1-175759 | 7/1989 | Japan ................................ 437/217 |
| 2-58359 | 2/1990 | Japan . |
| 3-131047 | 6/1991 | Japan . |
| 2027990 | 2/1980 | United Kingdom . |

OTHER PUBLICATIONS

Research Disclosure Document, "Stress Relief for Tape Automated Bonding (TAB) Tape," Oct. 1988, No. 29401, anonymously disclosed, Kenneth Mason Publications, Ltd., England.

*Primary Examiner*—Carl J. Arbes
*Attorney, Agent, or Firm*—Patricia S. Goddard

[57] ABSTRACT

Deformation of TAB tapes due to temperature changes is prevented by thermo-mechanical leads. In one embodiment of the invention, a semiconductor device (30) includes an electronic component (31) and a TAB tape. The tape includes a carrier film (12) and electrical leads (20) formed on the carrier film. The electrical leads are electrically coupled to the electronic component. Also included on the carrier film are thermo-mechanical leads (32) which are formed in opposing regions of the carrier film, regions which are typically void of leads. The thermo-mechanical leads have approximately the same lead pitch as the electrical leads in order to provide a uniform distribution of stresses across the TAB tape upon exposure to varying temperatures.

18 Claims, 2 Drawing Sheets

METHOD FOR MAKING TAPE AUTOMATED BONDING (TAB) SEMICONDUCTOR DEVICE

This is a divisional of application Ser. No. 07/745,655, filed Aug. 16, 1991, now U.S. Pat. No. 5,289,032 issued Feb. 22, 1994.

FIELD OF THE INVENTION

The present invention relates to semiconductor devices in general, and more specifically to tape automated bonding (TAB) semiconductor devices and methods for making the same.

BACKGROUND OF THE INVENTION

TAB semiconductor devices are devices which use tape-automated bonding (TAB) techniques and components. TAB devices are becoming increasingly popular because TAB tapes enable conductive leads formed on the tape to be very closely spaced. Closely spaced leads permit semiconductor manufacturers to keep device size to a minimum, a goal manufacturers are continually trying to achieve.

FIG. 1 illustrates a conventional TAB tape 10 which is representative of those used in semiconductor device fabrication. TAB tape 10 is formed of a carrier film 12 which is typically a thin polymer, for example a polyimide. Carrier film 12 is provided with alignment holes 14 which are used to align the film in various fabrication tools and with sprocket holes 16 which may be used to advance the film through these tools. A component receiving area 18 is also provided in the film for placement of an electrical component such as an integrated circuit (not shown). On carrier film 12, a plurality of electrical leads 20 extend outward from each side of component receiving area 18. The electrical leads are typically formed from a thin copper film which is either plated on or adhesively bonded to carrier film 12. Each lead has an inner lead portion 22 which is to be electrically coupled to bonding pads of an electronic component (not shown) during inner lead bonding (ILB), and an outer lead portion 24 which is to be electrically coupled to external circuitry (not shown) during outer lead bonding (OLB). Outer lead portions 24 may be coupled to a conventional lead frame, in which case leads 20 are completely internal to a packaged semiconductor device, or the outer lead portions may be external to a packaged device and be electrically coupled to, for example, a printed circuit board. In other applications, for example in flip TAB technology, inner lead portions 22 are cut from carrier film 12 such that the severed ends of the inner leads are bonded to external circuitry and the outer lead portions are not used.

A common feature of existing TAB tape structures, and of other types of lead frames, is that lead pitch is most narrow near the component receiving area and progressively gets wider as the leads extend outward. Lead pitch refers to the closeness of the leads and is usually defined as the distance from the center of one lead to the center of an adjacent lead. Another common feature of many TAB tape structures is that there are often rather large areas of the carrier film which are bare, or in other words have no leads formed thereon. With reference to FIG. 1, these bare areas are depicted as regions A, B, C, and D within carrier film 12. Regions A, B, C, and D are created as a result of having leads 20 extend outward from each of four sides of component receiving area 18. Because the lead pitch changes as the leads extend outward from the component receiving area, regions A, B, C, and D usually approximate a diamond-shaped appearance at corners adjacent to component receiving area 18. In other cases, the pitch of the inner and outer lead portions is the same (in other words the leads do not "fan-out") in which case regions A, B, C, and D may not be diamond-shaped.

The presence of bare carrier film regions A, B, C, and D creates a substantial problem in fabricating reliable semiconductor devices which use a TAB tape. As a result of non-uniform stress in a carrier film, the TAB tape becomes deformed, making device fabrication difficult. Copper and polyimide, which make-up most TAB tapes, have different thermal expansion rates over various temperature ranges, including those temperatures experienced during device operation. Changes in temperature cause regions A, B, C, and D to expand and contract at different rates than other regions of carrier film 12 which have overlying copper electrical leads. Differences in expansion and contraction are explained by the fact that copper often has a coefficient of thermal expansion (CTE) which is different than CTEs of polymers used to form the carrier film. Because copper expands and contracts at a different rate for a given temperature change than does the carrier film, stress is created in the TAB tape which leads to deformation of the tape. FIG. 2 illustrates an example of a cross-sectional view taken along line 2—2 of TAB tape 10 in FIG. 1. As illustrated, carrier film 12 is deformed much in the way the film would deform in actual use, albeit the illustration is somewhat exaggerated for purposes of clearly understanding the problem. In practice, portions of the carrier film having overlying leads 20 may become convex relative to the upper surface of the film, while bare regions of the film, such as region D, may become concave upon experiencing a rise in temperature. Expansion rates for a given material vary with temperature; therefore, the deformation of carrier film 12 may be different than that illustrated in FIG. 2. For example, region D may become convex while portions of the carrier film having overlying leads 20 may become concave. Furthermore, the type of copper and polyimide used in a TAB tape will also affect the behavior of carrier film 12 during temperature changes.

Deformation of a TAB tape due to temperature fluctuations creates at least two problems in semiconductor devices. The first problem is related to assembly of a TAB semiconductor device, while the second is related to reliability of the device once assembled. In assembly of a TAB semiconductor device, deformation of the film causes leads 20 to become non-coplanar. Non-coplanarity of leads makes it difficult to properly bond the leads to either an electronic component, in the case of inner lead bonding (ILB), or to external circuitry, in the case of outer lead bonding (OLB). In bonding leads which are non-coplanar, the bonding process requires added operator attention and is very slow, often resulting in low device yield. Furthermore, non-coplanar leads often result in a misalignment of leads once the leads are bonded to bonding pads of an electronic component or external circuitry. From a device reliability point of view, deformation of a TAB tape within a finished TAB device may negatively impact device performance. A carrier film in a device may want to deform to relieve stress caused by a rise or fall in temperature within the semiconductor device or the surrounding environment. As the film deforms, bonds between leads and bonding pads of, for example, an integrated circuit or a printed circuit board may become broken, resulting in open circuits.

There are numerous factors which affect the degree and type of deformation of a TAB tape and, therefore, which affect TAB device performance. As mentioned previously, one factor is the mismatch of CTE values for various components in a TAB device. For the temperature range of interest in typical electronic systems (0°–100° C.), approximate CTE values for major components are as follows: the CTE of copper is in the range of 5–22 ppm (parts per million)/°C.; the CTE of polyimide films and adhesives commonly used in TAB devices range from 8–16 ppm,/°C.; and the CTE of a common electronic component, a silicon die, is about 2.5–3.0 ppm/°C. As is evident from these values, the degree CTE mismatch between component can vary substantially. Furthermore the orientation of a component may also affect the expansion rates of the various components. For example, the CTE of copper and that CTE of a polyimide film can vary in the 'X' and 'Y' dimensions of the film (the film processing direction and the direction perpendicular to the processing direction, respectively). Such anisotropic behavior of a material's CTE is caused by preferred orientation of microstructural phases or regions in the films, such as copper crystals and polyimide molecules.

Yet another factor affecting TAB device performance is the ability of a TAB tape to accommodate stresses caused by temperature changes. The modulus of elasticity of commonly used polyimide films is quite high, while the thickness of most TAB polyimide films is 25–125 μm. A combination of the polyimide film's high strength, stiffness, and thickness causes the polyimide to transfer some of the stress induced in the polyimide during temperature changes to much thinner copper leads. This stress transfer results in straining of the copper. If the strain exceeds the elastic limit of the copper, permanent plastic deformation occurs, thereby creating dislocations in the copper. Temperature cycling causes the dislocations to precipitate voids in the highly strained regions, leading to copper cracking which is also known in the art as fatigue failure. Cracked copper leads, if severe enough, will cause open circuits in the device or in a system application. Fatigue failure of copper leads is especially a problem in leads which are bonded to corners of an electronic component, such as an integrated circuit or silicon die. Fatigue failure is further accelerated by the fact that deformation of a TAB tape, particularly the portions of the tape nearest corners of the electronic component, adds a torsional component to the stress exerted on the corner leads. Also, inner lead portions of a copper lead are more susceptible to fatigue failure because inner lead portions have smaller lead dimensions than outer lead portions. Susceptibility to failure of inner lead portions is also due to the fact that inner lead portions are exposed to higher temperatures than outer lead portions since the inner lead portions are closest to an electronic component.

In view of the foregoing discussion, and more particularly, in view of the deficiencies and problems of existing TAB semiconductor devices presented above, a need exists for an improved TAB semiconductor device which has a reduced amount of deformation in a TAB tape or carrier film upon exposure to temperature changes. Further, a need exists for a method of making such an improved TAB semiconductor device.

SUMMARY OF THE INVENTION

The previously mentioned needs are fulfilled and other advantages are achieved with the present invention. In one embodiment, a TAB semiconductor device has an electronic component and a TAB tape. The TAB tape is formed of a carrier film which supports electrical leads used to electrically interconnect the electronic component to external circuitry. The electrical leads have a predetermined spatial density and are patterned such that the carrier film is void of electrical leads in predetermined opposing sections of the carrier film which are adjacent to the electronic component. Thermo-mechanical leads having the predetermined spatial density occupy the predetermined opposing sections of the carrier film which are void of electrical leads.

These and other features, and advantages, of the present invention will be more clearly understood from the following detailed description taken in conjunction with the accompanying drawings. It is to be understood that the drawings may not be illustrated to scale, but are drawn to clearly depict aspects which are necessary for a complete understanding of the invention.

DETAILED DESCRIPTION OF A PREFERRED EMBODIMENT

Figure 1:
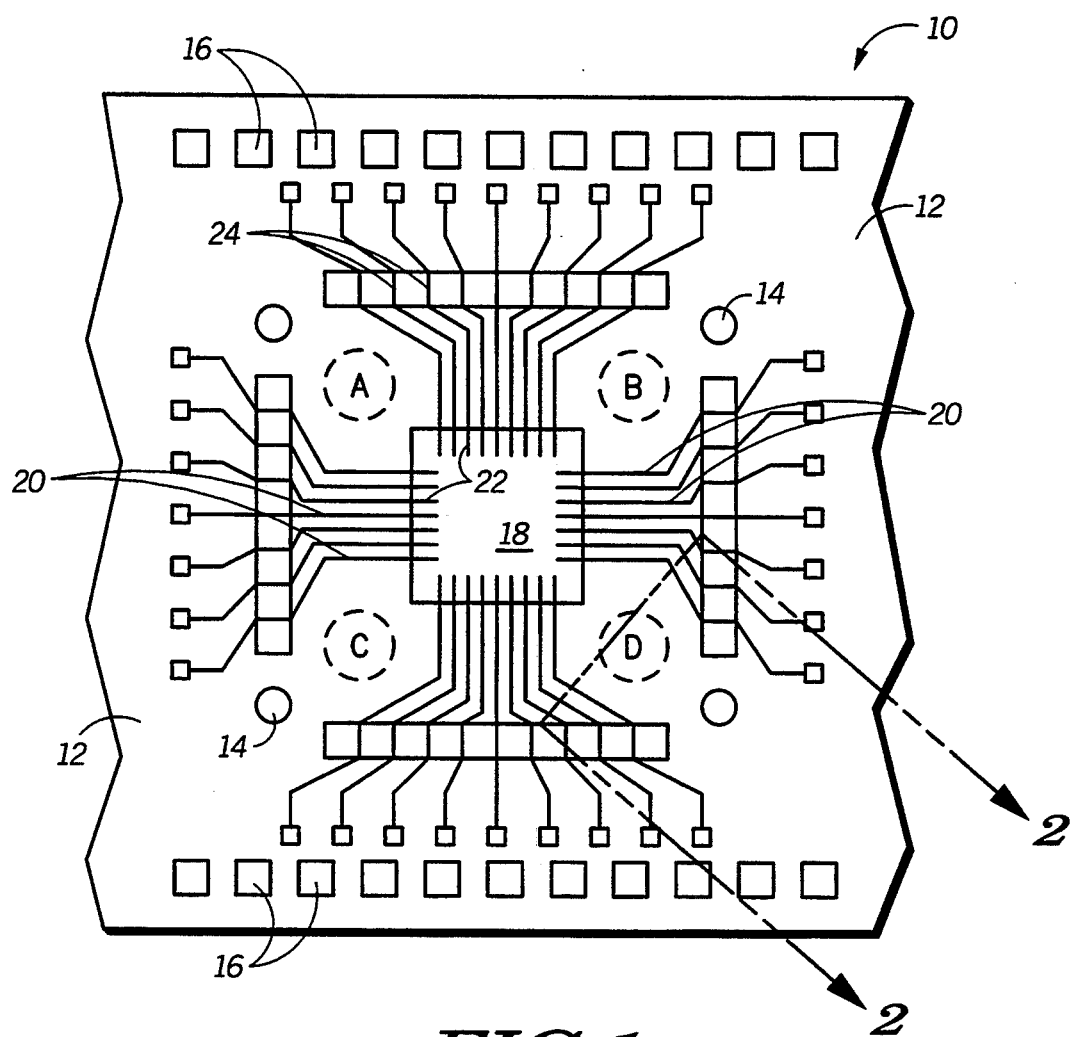
FIG. 1 illustrates, in plan view, a conventional TAB tape used in semiconductor devices.
Figure 2:
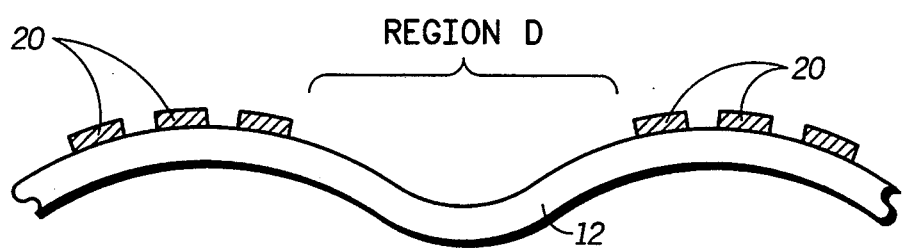
FIG. 2 illustrates a cross-sectional view of the TAB tape of FIG. 1 taken along the line 2—2.
Figure 3:
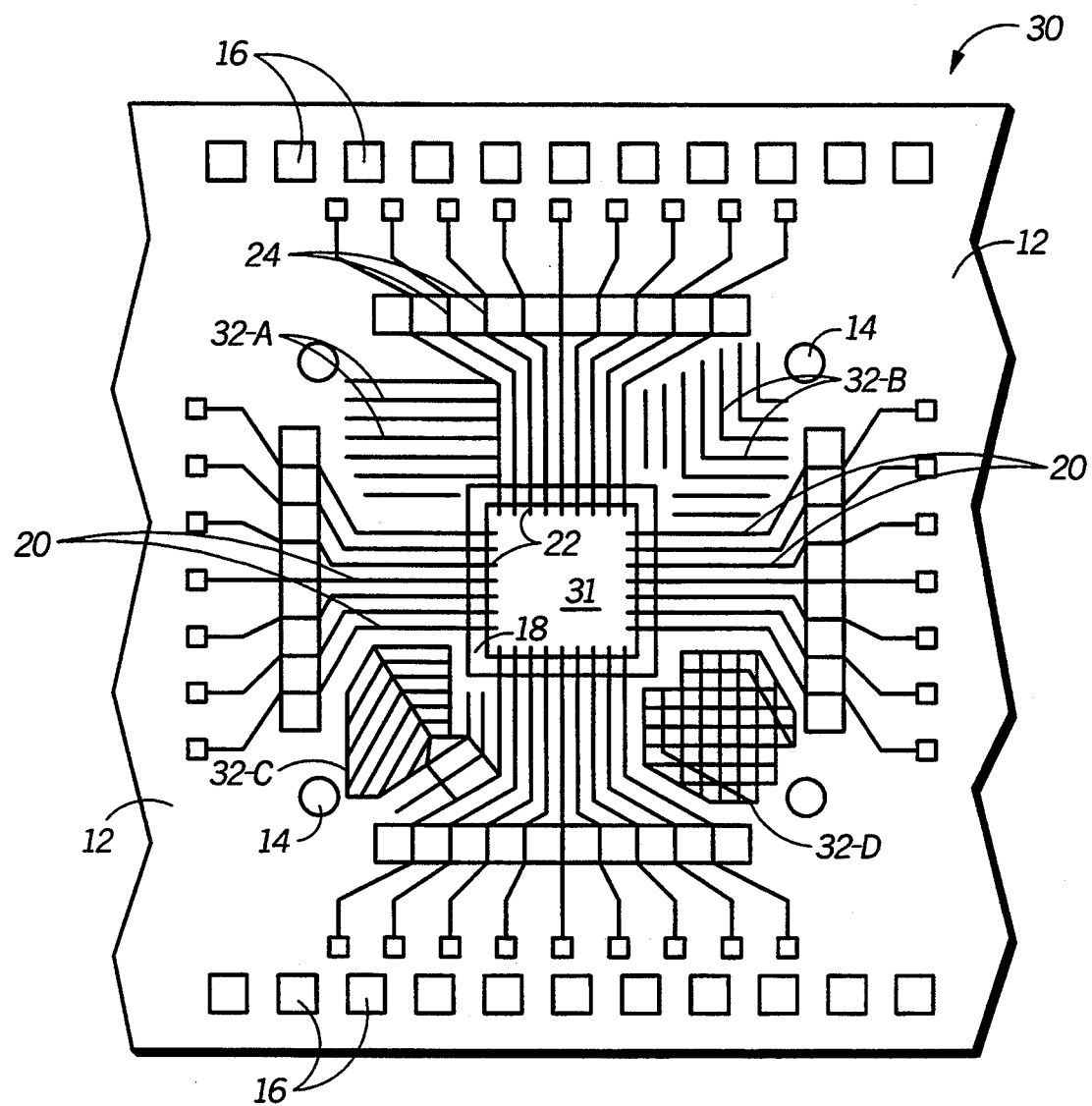
FIG. 3 illustrates, in plan view, a TAB tape of a semiconductor device formed in accordance with the present invention.

The problem of non-uniform deformation of TAB tapes or carrier films in semiconductor devices is overcome by the present invention. In one embodiment of the invention, regions of a carrier film which do not have overlying electrical leads are provided with thermo-mechanical leads having a lead pattern density similar to the lead pattern of the electrical leads. FIG. 3 illustrates a TAB semiconductor device 30 having several lead patterns of thermo-mechanical leads suitable for use in practicing the present invention. In discussing FIG. 3 in reference to the present invention, elements which are synonymous to those of TAB tape 10 of FIG. I are labeled the same. Device 30 includes an electronic component 31 positioned within component receiving area 18 and electrically coupled to electrical leads 20. Electronic component 31 may be a semiconductor device such as an integrated circuit or the like. The electronic component is coupled to the leads by bonding inner lead portions 22 to bonding pads (not shown) formed on the electronic component. In addition to having electrical leads 20, carrier film 12 is provided with thermo-mechanical leads 32. Thermo-mechanical leads which have been placed in region A of the carrier film of FIG. I are designated as thermo-mechanical leads 32-A. Thermo-mechanical leads 32-B, 32-C, and 32-D likewise correspond to regions B, C, and D, respectively. The presence of thermo-mechanical leads 32 in regions of carrier film 12 which are normally bare establishes a uniform distribution of stress across the film such that deformation of the film as a result of temperature change is reduced. To further ensure a uniform distribution of stress in the film, thermo-mechanical leads 32 are patterned similarly to electrical leads 20. In other words, the pitch or density of thermo-mechanical leads 32 is approximately the same as the pitch of electrical leads 20. The thermo-mechanical leads are most easily formed at the same time the electrical leads are formed and using the same material, preferably copper or a copper-alloy. Other materials may be used for thermo-mechanical leads 32, although use of a material different than the material used for electrical leads 20 would increase tape fabrication complexity.

In choosing a suitable lead pattern for thermo-mechanical leads 32 used in accordance with the present invention, a wide choice of lead patterns exist. Four different lead patterns, represented by thermo-mechanical leads 32-A, 32-B, 32-C, and 32-D, are illustrated in FIG. 3, although it should be understood the other lead patterns are also feasible. Thermo-mechanical leads 32-A are simply formed parallel to one another, having a pitch comparable to the pitch of electrical leads 20. It is desirable to have as much of the corner regions between the electrical leads occupied by thermo-mechanical leads as possible, given a predetermined lead density, therefore some thermo-mechanical leads may be longer or shorter than others. Varying thermo-mechanical lead lengths has no adverse effects on TAB device 30, and in fact is advantageous since the use of various thermo-mechanical lead lengths can increase the amount of corner space occupied. Another feature of thermo-mechanical leads 32-A is that some of the thermo-mechanical leads are coupled, both physically and electrically, to one of the electrical leads. Although not a requirement in practicing the invention, having one or more thermo-mechanical leads coupled to an electrical lead of constant electrical potential, such as a GROUND or POWER lead, will reduce resistance and inductance in the particular electrical lead due to an increase in the effective area of the lead. Furthermore, thermo-mechanical leads held at constant potential will likely protect the device from ESD (electrostatic discharge) and EMI (electromagnetic interference).

Thermo-mechanical leads 32-B represent another lead pattern suitable for use in the present invention. Thermo-mechanical leads 32-B are formed in a fishbone pattern, having approximately the same lead spacing as electrical leads 20. As in the previously described lead pattern, thermo-mechanical leads 32-B occupy as much of the corner region as possible for a given lead pitch. Unlike the previously described lead pattern, thermo-mechanical leads 32-B are not coupled to any of the electrical leads, and therefore provide only structural utility in preventing non-uniform deformation of carrier film 12 in region B.

FIG. 3 includes two additional lead patterns represented by thermo-mechanical leads 32-C and 32-D. Thermo-mechanical leads 32-C have no symmetrical pattern, but are spaced apart at distances approximately equal to the spacing between electrical leads 20. Another feature of thermo-mechanical leads 32-C is that the individual leads are connected to one another and therefore might arguably be described as one continuous lead. It is important to note, however, that the use of a plurality of disjoint thermo-mechanical leads and the use of a plurality of joined thermo-mechanical leads are both within the scope of this invention. As FIG. 3 illustrates, one of the thermo-mechanical leads 32-C is electrically coupled to an electrical lead 20, thus all of thermo-mechanical leads 32-C are coupled to the same electrical lead 20. As discussed above, electrical lead inductance and resistance are lowered by coupling an electrical lead to one or more thermo-mechanical leads since the effective area of the electrical lead is increased. If held at a constant electrical potential, such as GROUND or POWER, the thermo-mechanical leads may also serve to improve ESD and EMI protection.

Thermo-mechanical leads 32-D represent a thermo-mechanical lead pattern which is grid-like or mesh-like in appearance. The grid pattern is formed by having a plurality of thermo-mechanical leads intersect each other at approximately 90° angles. It is important to note however, that not all leads need intersect at the same angle and that intersection angles need not be 90°. Spacing between individual thermo-mechanical leads 32-D is similar to spacing between individual electrical leads 20. As mentioned above, the thermo-mechanical leads may or may not be electrically coupled to one or more of electrical leads 20. A grid pattern for thermo-mechanical leads such as that illustrated in FIG. 3 may be used either alone or in conjunction with another type of thermo-mechanical lead pattern to provide a uniform distribution of stress across carrier film 12.

In fabricating a TAB semiconductor device in accordance with the present invention, thermo-mechanical structures used to reduce deformation of a carrier film may be excised from the film just prior to outer lead bonding (OLB). An advantage in removing the thermo-mechanical structures is to reduce the overall size of a TAB device while providing EMI protection and reduced film deformation during device assembly. However, by not removing the thermo-mechanical structures, deformation of the carrier film can be reduced throughout device lifetime.

It is apparent from the description of the various thermo-mechanical lead patterns illustrated in FIG. 3 that lead patterns used in accordance with the present invention may take many forms. There is no restriction as to whether a thermo-mechanical lead pattern is symmetric or asymmetric, whether individual thermo-mechanical leads are disjoint or connected, or whether or not one or more of the thermo-mechanical leads is electrically coupled to an electrical lead. It is, however, beneficial to have the lead pattern of the thermo-mechanical leads comparable in lead density or lead pitch to the lead pattern of the electrical leads. Having a uniform density of leads surrounding a component receiving area will establish a uniform stress distribution in a TAB tape or carrier film and will thus minimize tape deformation. While FIG. 3 illustrates different lead patterns in each corner region of TAB device 30, corner regions of a device may instead have identical or similar lead patterns. In some instances it may be preferred to orient a lead pattern perpendicular to the diagonal to better constrain regional deformation. In other instances, a parallel orientation may be preferred. Other orientations are also possible.

The foregoing description and illustrations contained herein demonstrate many of the advantages associated with the present invention. In particular, it has been revealed that by providing thermo-mechanical leads in regions of a TAB tape or carrier film which normally are leadless, film deformation caused by temperature changes is minimized. The presence of thermo-mechanical leads helps to make stress in the film more uniform, thereby minimizing film deformation. In minimizing film deformation, assembly of TAB semiconductor devices is made easier and the reliability of packaged TAB semiconductor devices is improved. Other advantages in using thermo-mechanical leads as described above include the fact that no additional costs are incurred in making a TAB tape since the thermo-mechanical lead pattern may be accomplished at the same time, and with the same material, as the traditional electrical lead pattern. Furthermore, the thermo-mechanical leads used in a device in accordance with the present invention may be coupled to an electrical lead held at constant potential to reduce lead inductance and resistance and to improve ESD and EMI protection.

Thus it is apparent that there has been provided, in accordance with the invention, a TAB semiconductor device and method of making the same that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, thermo-mechanical lead patterns used in accordance with the present invention may be configured differently than those lead patterns illustrated or described. In addition, the invention is not limited to use in semiconductor devices having electrical leads extending from four sides of a component receiving area. TAB devices having leads extending from only two sides of a component receiving area may exhibit similar TAB tape deformation during temperature changes, and therefore can benefit from the present invention as well. As an example, thermo-mechanical leads might be used along entire right and left sides of a component receiving area which has leads extending from the top and bottom of the component receiving area. Prior to bonding electrical leads to external circuitry, the thermo-mechanical leads along the right and left sides may then be excised to reduce device area. It is also important to note that the TAB tapes illustrated are merely representative of the many existing TAB tape structures. The present invention may be implemented in semiconductor devices using any of the known TAB tapes, regardless of the tape appearance in comparison to the TAB tapes described or illustrated herein. Furthermore, the present invention is not limited by the type of electronic component coupled to a TAB tape. Therefore, it is intended that this invention encompass all such variations and modifications as fall within the scope of the appended claims.

We claim:

1. A method for making a tape automated bonding (TAB) semiconductor device comprising the steps of:
   providing an electronic component having a plurality of bonding pads arranged on a face thereof;
   providing a TAB tape comprising:
      a carrier film;
      a component receiving area formed in the carrier film;
      a plurality of electrical leads having a predetermined lead pitch supported by the carrier film, each lead having an inner lead portion located within the component receiving area and an outer lead portion which extends outward from the component receiving area, the plurality of electrical leads patterned such that diagonally opposing sections of the carrier film are void of electrical leads; and
      a plurality of thermo-mechanical leads having the predetermined lead pitch and positioned in the diagonally opposing sections of the carrier film, the thermo-mechanical leads providing a substantially uniform distribution of stresses in the carrier film:
   positioning the electronic component in the component receiving area; and
   electrically coupling the inner lead portion of each of the plurality of electrical leads to a respective one of the plurality of bonding pads.

2. The method of claim 1 wherein the step of providing a TAB tape comprises providing a TAB tape comprising a plurality of electrical leads and a plurality of thermo-mechanical leads, wherein the plurality of electrical leads and the plurality of thermo-mechanical leads are made of a same material.

3. The method of claim 1 wherein the step of providing a TAB tape comprises providing a TAB tape comprising a plurality of electrical leads and a plurality of thermo-mechanical leads, wherein at least one of the thermo-mechanical leads is electrically coupled to one of the electrical leads.

4. The method of claim 1 wherein the step of providing a TAB tape comprises providing a TAB tape comprising a plurality of electrical leads and a plurality of thermo-mechanical leads, wherein the plurality of electrical leads and the plurality of thermo-mechanical are electrically isolated.

5. The method of claim 1 further comprising the step of excising the diagonally opposing sections of the carrier film having the plurality of thermo-mechanical leads from the TAB tape.

6. The method of claim 5 wherein the step of excising is performed after the step of electrically coupling the inner lead portions.

7. The method of claim 1 wherein the step of providing a TAB tape comprises providing a TAB tape wherein the plurality of thermo-mechanical leads is contained entirely on the carrier film without extending into the component receiving area.

8. The method of claim 1 wherein the step of providing a TAB tape comprises providing a TAB tape having a plurality of thermo-mechanical leads in each of four diagonally opposing regions of the carrier film.

9. A method for making a tape automated bonding (TAB) semiconductor device, comprising the steps of:
   providing a semiconductor die;
   providing a TAB tape, wherein the TAB tape comprises:
      a carrier support film having a die receiving opening formed therein, wherein the opening has four sides and four corners;
      a plurality of electrical leads formed on the carrier support film, adjacent each of the four sides of the opening, and partially extending into the opening; and
      a plurality of thermo-mechanical leads formed on the carrier support film, adjacent at least one of the corners of the opening, without extending into the opening, the thermo-mechanical leads serving to substantially equalize any thermal stresses over the carrier support film;
   positioning the semiconductor die within the opening of TAB tape; and
   electrically coupling the semiconductor die to the plurality of electrical leads.

10. The method of claim 9 wherein the step of providing a TAB tape comprises providing a TAB tape wherein the plurality of electrical leads and the plurality of thermo-mechanical leads have substantially similar spatial densities.

11. The method of claim 9 wherein the step of electrically coupling comprising bonding the plurality of electrical leads to the semiconductor die.

12. The method of claim 9 wherein the step of providing a TAB tape comprises providing a TAB tape wherein the plurality of thermo-mechanical leads are present adjacent each of the four corners of the opening.

13. The method of claim 9 further comprising the step of excising portions of the carrier film having the plurality of thermo-mechanical leads thereon.

14. The method of claim 9 wherein the step of providing a TAB tape comprises providing a TAB tape wherein at least one of the plurality of thermo-mechanical leads is physically coupled to at least one of the plurality of electrical leads.

15. A method for making a tape automated bonding (TAB) semiconductor device, comprising the steps of:
   providing a semiconductor die;
   providing a TAB tape comprised of:
      a carrier film having an opening therein, the opening having a perimeter;
      a first plurality of metal traces formed on the carrier film, around the perimeter of the opening, and partially extending into the opening;
      a second plurality of metal traces formed on the carrier film, around the perimeter of opening, without extending into the opening;
      wherein together the first and second pluralities of metal traces fully populate the carrier film around the perimeter of the opening to make thermal stresses around the opening substantially uniform;
   positioning the semiconductor die within the opening; and electrically coupling the first plurality of metal traces to the semiconductor die.

16. The method of claim 15 wherein the step of providing a TAB tape comprises providing a TAB tape wherein the first plurality of metal traces and the second plurality of metal traces have substantially similar spatial densities.

17. The method of claim 16 wherein the step of providing a TAB tape comprises providing a TAB tape wherein the spatial density of all metal traces is substantially consistent around the perimeter opening.

18. The method of claim 15 wherein the step of providing a TAB tape comprises providing a TAB tape having an opening with four sides and four corners, and wherein traces of the first plurality of metal traces are formed adjacent each of the four sides of the opening, and traces of the second plurality of metal traces are formed adjacent each of the four corners.

* * * * *